United States Patent
Fang et al.

(10) Patent No.: US 10,468,549 B2
(45) Date of Patent: Nov. 5, 2019

(54) SEMICONDUCTOR DEVICE CONTAINING NITROGEN

(71) Applicant: Genesis Photonics Inc., Tainan (TW)

(72) Inventors: Hsin-Chiao Fang, Tainan (TW);
Cheng-Hsueh Lu, Tainan (TW);
Cheng-Hung Lin, Changhua (TW);
Chi-Hao Cheng, Tainan (TW);
Chi-Feng Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 30 days.

(21) Appl. No.: 15/708,162

(22) Filed: Sep. 19, 2017

(65) Prior Publication Data
US 2018/0083162 A1    Mar. 22, 2018

(30) Foreign Application Priority Data
Sep. 19, 2016  (TW) .............................. 105130173 A

(51) Int. Cl.
| H01L 33/14 | (2010.01) |
| H01L 33/06 | (2010.01) |
| H01L 33/02 | (2010.01) |
| H01L 33/32 | (2010.01) |

(52) U.S. Cl.
CPC .......... *H01L 33/145* (2013.01); *H01L 33/025* (2013.01); *H01L 33/06* (2013.01); *H01L 33/32* (2013.01); *H01L 33/325* (2013.01)

(58) Field of Classification Search
CPC ....... H01L 33/145; H01L 33/32; H01L 33/06; H01L 33/025; H01L 33/325
See application file for complete search history.

(56) References Cited

U.S. PATENT DOCUMENTS

| 6,319,742 | B1 | 11/2001 | Hayashi et al. |
| 8,304,793 | B2 | 11/2012 | Yoshizumi et al. |
| 2002/0014632 | A1 | 2/2002 | Kaneyama et al. |
| 2003/0006418 | A1 | 1/2003 | Emerson et al. |
| 2003/0085409 | A1 | 5/2003 | Shen et al. |
| 2003/0189218 | A1 | 10/2003 | Watanabe et al. |

(Continued)

FOREIGN PATENT DOCUMENTS

| CN | 1409875 | 4/2003 |
| CN | 1440578 | 9/2003 |

(Continued)

OTHER PUBLICATIONS

"Office Action of Related U.S. Appl. No. 15/453,873", dated Mar. 5, 2018, p. 1-p. 9.

(Continued)

*Primary Examiner* — John P. Dulka
(74) *Attorney, Agent, or Firm* — JCIPRNET

(57) ABSTRACT

A nitrogen-containing semiconductor device including a first type doped semiconductor layer, a multiple quantum well layer and a second type doped semiconductor layer is provided. The multiple quantum well layer includes barrier layers and well layers, and the well layers and the barrier layers are arranged alternately. The multiple quantum well layer is located between the first type doped semiconductor layer and the second type doped semiconductor layer, and one of the well layers of the multiple quantum well layer is connected to the second type doped semiconductor layer.

35 Claims, 6 Drawing Sheets

(56) References Cited

U.S. PATENT DOCUMENTS

| | | |
|---|---|---|
| 2004/0264533 A1 | 12/2004 | Matsumura et al. |
| 2005/0179027 A1 | 8/2005 | Kim et al. |
| 2005/0224781 A1 | 10/2005 | Kneissl et al. |
| 2005/0224835 A1 | 10/2005 | Nomura et al. |
| 2006/0118820 A1 | 6/2006 | Gaska et al. |
| 2006/0175600 A1 | 8/2006 | Sato et al. |
| 2007/0045638 A1 | 3/2007 | Shen et al. |
| 2007/0096077 A1* | 5/2007 | Sanga .............. H01L 29/205 257/13 |
| 2007/0181869 A1 | 8/2007 | Gaska et al. |
| 2008/0116476 A1 | 5/2008 | Komada |
| 2008/0251781 A1 | 10/2008 | Han et al. |
| 2008/0315243 A1 | 12/2008 | Ueno et al. |
| 2009/0008648 A1 | 1/2009 | Biwa et al. |
| 2009/0008659 A1 | 1/2009 | Ohno et al. |
| 2009/0026489 A1 | 1/2009 | Kuramoto |
| 2009/0057696 A1 | 3/2009 | Kuo et al. |
| 2009/0224226 A1 | 9/2009 | Huang et al. |
| 2010/0025652 A1 | 2/2010 | Stauss |
| 2010/0142576 A1 | 6/2010 | Cohen et al. |
| 2010/0213436 A1 | 8/2010 | Khan |
| 2011/0001126 A1 | 1/2011 | Kamikawa et al. |
| 2011/0012089 A1 | 1/2011 | Khan et al. |
| 2011/0114916 A1 | 5/2011 | Yoshizumi et al. |
| 2012/0069863 A1 | 3/2012 | Sizov et al. |
| 2012/0217473 A1 | 8/2012 | Shur et al. |
| 2012/0319080 A1 | 12/2012 | Fudeta et al. |
| 2013/0001509 A1 | 1/2013 | Fudeta et al. |
| 2013/0099141 A1 | 4/2013 | Chua |
| 2013/0161586 A1 | 6/2013 | Okuno et al. |
| 2013/0277642 A1 | 10/2013 | Kneissl et al. |
| 2014/0001438 A1 | 1/2014 | Kim et al. |
| 2014/0183446 A1 | 7/2014 | Nago et al. |
| 2015/0179881 A1 | 6/2015 | Senes et al. |
| 2015/0263228 A1 | 9/2015 | Lee et al. |
| 2016/0118531 A1 | 4/2016 | Jain et al. |
| 2016/0322533 A1 | 11/2016 | Chang et al. |
| 2017/0117438 A1 | 4/2017 | Shur et al. |

FOREIGN PATENT DOCUMENTS

| | | |
|---|---|---|
| CN | 101073160 | 11/2007 |
| CN | 101188264 | 5/2008 |
| CN | 101330123 | 12/2008 |
| CN | 101339970 | 1/2009 |
| CN | 101461069 | 6/2009 |
| CN | 101494265 | 7/2009 |
| CN | 101527341 | 9/2009 |
| CN | 101540364 | 9/2009 |
| CN | 101626058 | 1/2010 |
| CN | 101645480 | 2/2010 |
| CN | 101684549 | 3/2010 |
| CN | 101689586 | 3/2010 |
| CN | 101740691 | 6/2010 |
| CN | 101944480 | 1/2011 |
| CN | 102005513 | 4/2011 |
| CN | 102130425 | 7/2011 |
| CN | 102157646 | 8/2011 |
| CN | 102185056 | 9/2011 |
| CN | 102201514 | 9/2011 |
| CN | 102208505 | 10/2011 |
| CN | 102214739 | 10/2011 |
| CN | 102214753 | 10/2011 |
| CN | 102474076 | 5/2012 |
| CN | 102820394 | 12/2012 |
| CN | 102856449 | 1/2013 |
| CN | 102859723 | 1/2013 |
| CN | 102881784 | 1/2013 |
| CN | 103137807 | 6/2013 |
| CN | 103650173 | 3/2014 |
| CN | 104704641 | 6/2015 |
| EP | 1221723 | 7/2002 |
| JP | H09321389 | 12/1997 |
| JP | H09326508 | 12/1997 |
| JP | H10135575 | 5/1998 |
| JP | 2000058904 | 2/2000 |
| JP | 2000196143 | 7/2000 |
| JP | 2001015437 | 1/2001 |
| JP | 2008034658 | 2/2008 |
| JP | 2009016452 | 1/2009 |
| JP | 2009152448 | 7/2009 |
| JP | 2010263140 | 11/2010 |
| JP | 2011023541 | 2/2011 |
| JP | 2014103384 | 6/2014 |
| TW | 402735 | 8/2000 |
| TW | 451504 | 8/2001 |
| TW | 200908393 | 2/2009 |
| TW | 200915618 | 4/2009 |
| TW | 200939519 | 9/2009 |
| TW | 201011952 | 3/2010 |
| TW | 201135967 | 10/2011 |
| TW | 201208112 | 2/2012 |
| TW | 201308658 | 2/2013 |
| WO | 2007013257 | 2/2007 |

OTHER PUBLICATIONS

"Office Action of China Related Application No. 201710702864.1", dated Nov. 20, 2018, pp. 1-13.
"Office Action of China Related Application No. 201710702885.3", dated Nov. 19, 2018, pp. 1-12.
"Office Action of Taiwan Related Application No. 104123883", dated Nov. 2, 2018, pp. 1-4.
"Office Action of China Related Application No. 201710702844.4", dated Oct. 12, 2018, pp. 1-6.
"Office Action of Related U.S. Appl. No. 15/453,873", dated Sep. 26, 2018, pp. 1-11.
"Office Action of China Related Application No. 201711123066.X", dated Dec. 5, 2018, pp. 1-6.
"Office Action of Taiwan Related Application No. 104123678", dated Dec. 11, 2018, pp. 1-6.
"Office Action of JP Related Application, application No. 2017-093911", dated Mar. 6, 2018, p. 1-p. 3.
"Office Action of Related U.S. Appl. No. 14/257,012", dated Nov. 16, 2017, p. 1-p. 13.
"Office Action of Taiwan Related Application, application No. 106115426", dated Sep. 19, 2017, p. 1-p. 3.
"Office Action of China Related Application No. 201710029565.6", dated Jul. 20, 2018, pp. 1-8.
"Office Action of Taiwan Related Application No. 107115825", dated Jul. 26, 2018, pp. 1-3.
"Office Action of Japan Related Application No. 2015156949", dated Jun. 5, 2018, pp. 1-10.
"Office Action of Related U.S. Appl. No. 15/723,117", dated Jul. 12, 2018, pp. 1-24.
"Office Action of Related U.S. Appl. No. 15/981,864", dated Jul. 16, 2018, pp. 1-21.
"Notice of Allowance of Related U.S. Appl. No. 15/627,419", dated Jul. 20, 2018, pp. 1-25.
"Notice of Allowance of Related U.S. Appl. No. 15/627,417", dated Jul. 19, 2018, pp. 1-22.
"Office Action of Taiwan Related Application, application No. 105143135", dated Dec. 25, 2017, p. 1-p. 12.
"Office Action of Taiwan Related Application, application No. 106140004", dated Feb. 5, 2018, p. 1-p. 5.
"Office Action of Related U.S. Appl. No. 15/627,419", dated Feb. 26, 2018, p. 1-p. 18.
"Office Action of Related U.S. Appl. No. 15/499,913", dated Feb. 16, 2018, p. 1-p. 40.
"Office Action of Related U.S. Appl. No. 15/627,417", dated Feb. 23, 2018, p. 1-p. 26.
"Office Action of China Related Application, Application No. 201711125219.4", dated Dec. 21, 2018, p. 1-p. 6.
"Office Action of China Related Application, Application No. 201810015565.5", dated Jan. 3, 2019, p. 1-p. 7.
"Office Action of Japan Related Application, Application No. 2015-156949", dated Nov. 27, 2018, p. 1-p. 9.

(56) References Cited

OTHER PUBLICATIONS

"Notice of allowance of Related U.S. Appl. No. 15/453,873", dated Jan. 24, 2019, p. 1-p. 21.
"Office Action of Taiwan Related Application, Application No. 107122851", dated Jan. 25, 2019, p. 1-p. 6.
"Office Action of China Related Application No. 201810344250.5", dated Apr. 15, 2019, pp. 1-8.
"Office Action of China Related Application No. 201810450395.3", dated Apr. 12, 2019, pp. 1-6.
"Office Action of China Related Application No. 201810345115.2", dated Apr. 1, 2019, pp. 1-14.
"Office Action of China Related Application No. 201810345069.6", dated Mar. 29, 2019, pp. 1-14.
"Office Action of China Related Application No. 201810016160.3", dated Mar. 29, 2019, pp. 1-8.
"Office Action of China Related Application No. 201810450545.0", dated Mar. 6, 2019, pp. 1-12.
"Office Action of China Related Application No. 201710702844.4", dated May 22, 2019, pp. 1-4.
"Office Action of China Related Application No. 201710136037.0", dated Jul. 30, 2019, pp. 1-8.

\* cited by examiner

SEMICONDUCTOR DEVICE CONTAINING NITROGEN

CROSS REFERENCE TO RELATED APPLICATION

This application claims the priority benefit of Taiwan application serial no. 105130173, filed on Sep. 19, 2016. The entirety of the above-mentioned patent application is hereby incorporated by reference herein and made a part of specification.

BACKGROUND OF THE INVENTION

1. Field of the Invention

The invention relates to a semiconductor device, and particularly relates to a nitrogen-containing semiconductor device.

2. Description of Related Art

In a conventional semiconductor device, in order to facilitate the chance of combination of electrons and holes and further stop electrons, a quaternary AlInGaN semiconductor layer is disposed between an active layer and a P-type semiconductor layer. In addition, magnesium or carbon in a high concentration may be added to the semiconductor layer. However, how to further facilitate carrier concentration and increase the carrier combination efficiency between the active layers remains an issue to work on.

SUMMARY OF THE INVENTION

The invention provides a nitrogen-containing semiconductor device. The nitrogen-containing semiconductor device has a preferable quality and light emitting efficiency.

A nitrogen-containing semiconductor device according to an embodiment includes a first type doped semiconductor layer, a multiple quantum well layer, and a second type doped semiconductor layer. The multiple quantum well layer includes barrier layers and well layers, and the well layers and the barrier layers are arranged alternately. The multiple quantum well layer is located between the first type doped semiconductor layer and the second type doped semiconductor layer, and one of the well layers of the multiple quantum well layer is connected to the second type doped semiconductor layer.

According to an embodiment of the invention, the second type doped semiconductor layer includes a first AlInGaN layer connected to the multiple quantum well layer, and the first AlInGaN layer is doped with a second type dopant.

According to an embodiment of the invention, the second type dopant in the first AlInGaN layer is Mg, and a doped concentration of Mg in the first AlInGaN layer is greater than $10^{19}$ cm$^{-3}$.

According to an embodiment of the invention, Al is distributed in a uniform concentration in the first AlInGaN layer.

According to an embodiment of the invention, a material of the first AlInGaN layer is $Al_{x1}In_{y1}Ga_{1-x1-y1}$, wherein $0 \leq x1 < 0.5$, and $0 \leq y1 < 0.3$.

According to an embodiment of the invention, a concentration of Al in the first AlInGaN layer increases from a side connected to the multiple quantum well layer to a side away from the multiple quantum well layer.

According to an embodiment of the invention, a material of the first AlInGaN layer is changed from $Al_{x1}In_{y1}Ga_{1-x1-y1}$ to $Al_{x2}In_{y2}Ga_{1-x2-y2}$, wherein $0 \leq x1, x2 < 0.5$, $0 \leq y1, y2 < 0.3$, and $x1 < x2$.

According to an embodiment of the invention, a thickness of the first AlInGaN layer is in a range from 0.1 nanometers to 20 nanometers.

According to an embodiment of the invention, the second type doped semiconductor layer further includes a second AlInGaN layer. The first AlInGaN layer is disposed between the multiple quantum well layer and the second AlInGaN layer. The second AlInGaN layer is doped with a second type dopant. A concentration of the second type dopant in the second AlInGaN layer is greater than a concentration of the second type dopant in the first AlInGaN layer.

According to an embodiment of the invention, the second type dopant in the second AlInGaN layer is Mg, C, or Mg and C, a doped concentration of Mg in the second AlInGaN layer is greater than $10^{19}$ cm$^{-3}$, a doped concentration of C in the second AlInGaN layer is greater than $1 \times 10^{17}$ cm$^{-3}$, and a concentration of C in the second AlInGaN layer is greater than a concentration of C in the first AlInGaN layer.

According to an embodiment of the invention, Al is distributed in a uniform concentration or distributed in alternate higher and lower concentrations in the second AlInGaN layer.

According to an embodiment of the invention, a concentration of Al in the second AlInGaN layer increases or decreases from a side connected to the first AlInGaN layer to a side away from the first AlInGaN layer.

According to an embodiment of the invention, a material of the second AlInGaN layer is $Al_{x1}In_{y1}Ga_{1-x1-y1}$, wherein $0 \leq x1 < 0.5$, and $0 \leq y1 < 0.3$.

According to an embodiment of the invention, a thickness of the second AlInGaN layer is between 0.1 nanometers and 150 nanometers.

According to an embodiment of the invention, the second type doped semiconductor layer further includes a third AlInGaN layer. The second AlInGaN layer is disposed between the first AlInGaN layer and the third AlInGaN layer, and the third AlInGaN layer is doped with a second type dopant.

According to an embodiment of the invention, the second type dopant in the third AlInGaN layer is Mg, C, or Mg and C, a doped concentration of Mg in the third AlInGaN layer is greater than $1 \times 10^{19}$ cm$^{-3}$, and a doped concentration of C in the third AlInGaN layer is greater than $1 \times 10^{7}$ cm$^{-3}$.

According to an embodiment of the invention, Al is distributed in a uniform concentration or distributed in alternate higher and lower concentrations in the third AlInGaN layer.

According to an embodiment of the invention, a concentration of Al in the third AlInGaN layer increases or decreases from a side connected to the second AlInGaN layer to a side away from the second AlInGaN layer.

According to an embodiment of the invention, a material of the third AlInGaN layer is $Al_{x1}In_{y1}Ga_{1-x1-y1}$, wherein $0 \leq x1 < 0.5$, and $0 \leq y1 < 0.3$.

According to an embodiment of the invention, a thickness of the third AlInGaN layer is between 0.1 nanometers and 200 nanometers.

According to an embodiment of the invention, the second type doped semiconductor layer further includes a GaN layer. The GaN layer is doped with a second type dopant, and the GaN layer and the first AlInGaN layer are disposed at two sides of the second type doped semiconductor layer.

According to an embodiment of the invention, the well layers are InGaN layers doped with a first type dopant, the barrier layers are GaN layers doped with a first type dopant, and a material of the well layers is $In_xGa_{1-x}N$, wherein 0.01≤x<0.5. A concentration of the first type dopant in the well layer connected to the second type doped semiconductor layer is lower than a concentration of the first type dopant in the rest of the well layers.

According to an embodiment of the invention, the first type dopant in the barrier layers and the well layers is Si. A concentration of Si in the well layer connected to the second type doped semiconductor layer is greater than $1 \times 10^{17}$ cm$^{-3}$, a concentration of Si in the rest of the well layers is greater than $3 \times 10^{17}$ cm$^{-3}$, and a concentration of Si in the barrier layers is greater than $3 \times 10^{17}$ cm$^{-3}$.

According to an embodiment of the invention, a thickness of the well layers is in a range from 1 nanometer to 6 nanometers, and a thickness of the barrier layers is in a range from 1 nanometer to 20 nanometers.

A nitrogen-containing semiconductor device according to an embodiment includes a first type doped semiconductor layer, a multiple quantum well layer, and a second type doped semiconductor layer. The multiple quantum well layer includes a first barrier layer, a plurality of second barrier layers and a plurality of well layers. A thickness of the first barrier layer is less than a thickness of the second barrier layers, and the well layers are alternately arranged with the first barrier layer and the second barrier layers. The multiple quantum well layer is located between the first type doped semiconductor layer and the second type doped semiconductor layer, and the first barrier layer is connected to the second type doped semiconductor layer.

According to an embodiment of the invention, a thickness of the first barrier layer is in a range from 0.1 nanometers to 20 nanometers.

According to an embodiment of the invention, a material of the first barrier layer includes AlInGaN, and the first barrier layer is doped with a second type dopant.

According to an embodiment of the invention, the second type dopant in the first barrier layer is Mg, and a doped concentration of Mg in the first barrier layer is greater than $1 \times 10^{19}$ cm$^{-3}$.

According to an embodiment of the invention, Al is distributed in a uniform concentration in the first barrier layer.

According to an embodiment of the invention, a material of the first barrier layer is $Al_{x1}In_{y1}Ga_{1-x1-y1}$, wherein 0≤x1<0.5, and 0≤y1<0.3.

According to an embodiment of the invention, a concentration of Al in the first barrier layer increases from a side connected to a well layer of the well layers to a side away from the well layer.

According to an embodiment of the invention, a material of the first barrier layer is changed from $Al_{x1}In_{y1}Ga_{1-x1-y1}$ to $Al_{x2}In_{y2}Ga_{1-x2-y2}$, wherein 0≤x1,x2<0.5, 0≤y1,y2<0.3, and x1<x2.

According to an embodiment of the invention, the second type doped semiconductor layer further includes a first AlInGaN layer connected to the first barrier layer. The first AlInGaN layer is doped with a second type dopant, and a concentration of the second type dopant in the first AlInGaN layer is greater than a concentration of the second type dopant in the first barrier layer.

According to an embodiment of the invention, the second type dopant in the first AlInGaN layer is Mg, C, or Mg and C. A doped concentration of Mg in the first AlInGaN layer is greater than $10^{19}$ cm$^{-3}$, a doped concentration of C in the first AlInGaN layer is greater than $10^{17}$ cm$^{-3}$, and a concentration of C in the first AlInGaN layer is greater than a concentration of C in the first barrier layer.

According to an embodiment of the invention, Al is distributed in a uniform concentration or distributed in alternate higher and lower concentrations in the first AlInGaN layer.

According to an embodiment of the invention, a concentration of Al in the first AlInGaN layer increases from a side connected to the first barrier layer to a side away from the multiple quantum well layer.

According to an embodiment of the invention, a material of the first AlInGaN layer is $Al_{x1}In_{y1}Ga_{1-x1-y1}$, wherein 0≤x1<0.5, and 0≤y1<0.3.

According to an embodiment of the invention, a thickness of the first AlInGaN layer is between 0.1 nanometers and 150 nanometers.

According to an embodiment of the invention, the second type doped semiconductor layer further includes a second AlInGaN layer. The first AlInGaN layer is disposed between the second AlInGaN layer and the first barrier layer, and the second AlInGaN layer is doped with a second type dopant.

According to an embodiment of the invention, the second type dopant in the second AlInGaN layer is Mg, C, or Mg and C. A doped concentration of Mg in the second AlInGaN layer is greater than $1 \times 10^{19}$ cm$^{-3}$, and a doped concentration of C in the second AlInGaN layer is greater than $1 \times 10^{17}$ cm$^{-3}$.

According to an embodiment of the invention, Al is distributed in a uniform concentration or distributed in alternate higher and lower concentrations in the second AlInGaN layer.

According to an embodiment of the invention, a concentration of Al in the second AlInGaN layer increases or decreases from a side connected to the first AlInGaN layer to a side away from the first AlInGaN layer.

According to an embodiment of the invention, a material of the second AlInGaN layer is $Al_{x1}In_{y1}Ga_{1-x1-y1}$, wherein 0≤x1<0.5, and 0≤y1<0.3.

According to an embodiment of the invention, a thickness of the second AlInGaN layer is in a range from 0.1 nanometers to 200 nanometers.

According to an embodiment of the invention, the second type doped semiconductor layer includes a GaN layer, the GaN layer is doped with a second type dopant, and the GaN layer is disposed at a side of the second type doped semiconductor layer away from the first barrier layer.

According to an embodiment of the invention, the well layers and the second barrier layers are InGaN layers doped with a first type dopant. The first barrier layer is a GaN layer doped with a second type dopant, a material of the well layers is $In_xGa_{1-x}N$, wherein 0.01≤x<0.5, and a concentration of the first type dopant in the well layer connected to the first barrier layer is lower than a concentration of the first type dopant in the rest of the well layers.

According to an embodiment of the invention, the first type dopant in the second barrier layers and the well layers is Si. A concentration of Si in the well layer connected to the first barrier layer is greater than $1 \times 10^{17}$ cm$^{-3}$, a concentration of Si in the rest of the well layers is greater than $3 \times 10^{17}$ cm$^{-3}$, and a concentration of Si in the second barrier layers is greater than $3 \times 10^{17}$ cm$^{-3}$.

According to an embodiment of the invention, a thickness of the well layers is in a range from 1 nanometer to 6 nanometers, and a thickness of the second barrier layers is in a range from 1 nanometer to 20 nanometers.

Based on the above, the nitrogen-containing semiconductor device according to an embodiment of the invention includes the multiple quantum well layer whose well layer is connected to the second type doped semiconductor layer, so as to provide preferable light emitting efficiency. Based on the above, the nitrogen-containing semiconductor device according to an embodiment of the invention includes the first barrier layer having a thinner thickness and connected to the second type doped semiconductor layer, so as to provide preferable light emitting efficiency.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
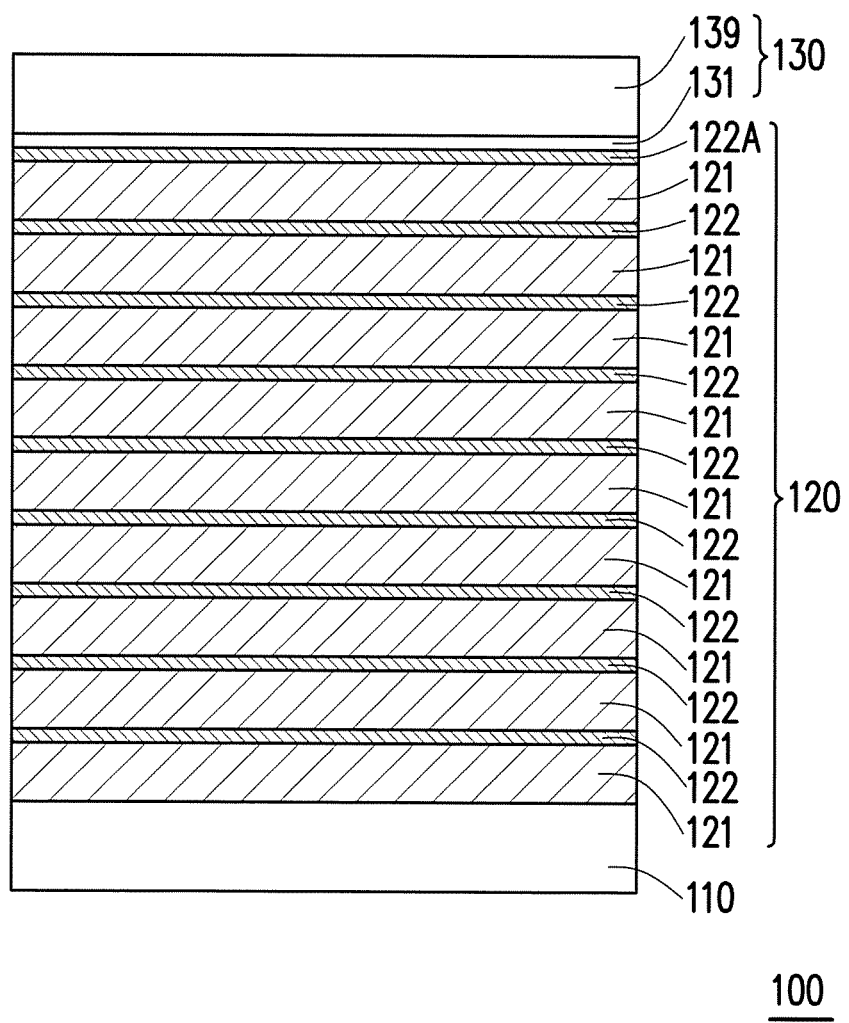
FIG. 1 is a schematic cross-sectional view illustrating a nitrogen-containing semiconductor device according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view illustrating a nitrogen-containing semiconductor device according to a first embodiment of the invention. Referring to FIG. 1, in the first embodiment of the invention, a nitrogen-containing semiconductor device 100 may serve as a light emitting semiconductor device or a power device and include a first type doped semiconductor layer 110, a multiple quantum well layer 120, and a second type doped semiconductor layer 130. The multiple quantum well layer 120 includes a plurality of barrier layers 121 and a plurality of well layers 122, and the well layers 122 are arranged alternately with the barrier layers 121. Specifically, in the multiple quantum well layer 120 of the embodiment, each well layer 122 is disposed between two of the barrier layers 121, and one of the well layers 122 and one of the barrier layers 121 are disposed at opposite sides of the multiple quantum well layer 120.

Referring to FIG. 1, the multiple quantum well layer 120 is located between the first type doped semiconductor layer 110 and the second type doped semiconductor layer 130. In addition, a well layer 122A of the well layers 122 is connected to the second type doped semiconductor layer 130. In other words, the well layer 122A disposed at a side of the multiple quantum well layer 120 is connected to the second type doped semiconductor layer 130.

Accordingly, in the embodiment, the well layer 122A is disposed at the side of the multiple quantum well layer 120 adjacent to the second type doped semiconductor layer 130. Thus, carriers from the second type doped semiconductor layer 130 may more effectively enter the multiple quantum well layer 120.

Specifically, in the embodiment, the first type doped semiconductor layer 110 is an n-type doped semiconductor layer providing electrons, for example, and the second type doped semiconductor layer 130 is a p-type doped semiconductor layer providing holes, for example. Since the well layer 122A is disposed at the side of the multiple quantum well layer 120 connected to the second type doped semiconductor layer 130, the holes from the second type doped semiconductor layer 130 may more effectively enter the multiple quantum well layer 120, thereby increasing the efficiency of electron-hole combination of the multiple quantum well layer 120. In other words, the multiple quantum well 120 of the embodiment enables a preferable electrical connection performance as well as light emitting efficiency of the nitrogen-containing semiconductor device 100.

Referring to FIG. 1, in the embodiment, the second type doped semiconductor layer 130 includes a first AlInGaN layer 131 connected to the multiple quantum well layer 120, and the first AlInGaN layer 131 is doped with a second type dopant. Accordingly, the first AlInGaN layer 131 may provide holes and also serve as a passivation layer of the well layer 122A.

More specifically, the second type dopant of the first AlInGaN layer 131 of the embodiment is Mg, and a doped concentration of Mg in the first AlInGaN layer 131 is greater than $10^{19}$ cm$^{-3}$. In addition, in addition to serving as the passivation layer of the well layer 122A, the first AlInGaN layer 131 may also inject holes to the multiple quantum well layer 120.

In the embodiment, a material of the first AlInGaN layer 131 of the nitrogen-containing semiconductor device 100 is $Al_{x1}In_{y1}Ga_{1-x1-y1}$, wherein 0≤x1<0.5, and 0≤y1<0.3. In addition, Al is distributed in a uniform concentration in the first AlInGaN layer 131, but the invention is not limited thereto.

In other embodiments of the invention, the material of the first AlInGaN layer 131 may be changed from $Al_{x1}In_{y1}Ga_{1-x1-y1}$ to $Al_{x2}In_{y2}Ga_{1-x2-y2}$, wherein 0≤x1,x2<0.5, 0≤y1, y2<0.3, and x1<x2, and the concentration of Al in the first AlInGaN layer 131 may increase from the side connected to the multiple quantum well layer 120 to the side away from the multiple quantum well layer 120.

Besides, a thickness of the first AlInGaN layer 131 in the first embodiment of the invention is in a range from 0.1 nanometers to 20 nanometers. However, the invention is not limited thereto.

The second type doped semiconductor layer 130 of the first embodiment of the invention further includes a GaN layer 139. The GaN layer 139 is doped with a second type dopant, and the GaN layer 139 and the first AlInGaN layer 131 are disposed at two sides of the second type doped semiconductor layer 130. More specifically, the second type dopant doped in the GaN layer 139 is Mg, for example. However, the invention is not limited thereto.

Moreover, the well layers 122 of the embodiment are InGaN layers doped with a first type dopant, and the barrier layers 121 are GaN layers doped with a first type dopant, and a material of the well layers 122 is $In_xGa_{1-x}N$, wherein $0.01 \leq x < 0.5$. A concentration of the first type dopant in the well layer 122A connected to the second type doped semiconductor layer 130 is lower than a concentration of the first type dopant in rest of the well layers 122. Therefore, the well layer 122A may prevent the first type dopant in the multiple quantum well layer 120 and the second type dopant of the second type doped semiconductor layer 130 from being mixed with each other.

In the embodiment, the first type dopant of the barrier layers 121 and the well layers 122 of the embodiment is Si. A concentration of Si in the well layer 122A connected to the second type doped semiconductor layer 130 is greater than $1 \times 10^{17}$ cm$^{-3}$, a concentration of Si in the rest of the well layers 122 is greater than $3 \times 10^{17}$ cm$^{-3}$, and a concentration of Si in the plurality of barrier layers 121 is greater than $3 \times 10^{17}$ cm$^{-3}$. Therefore, the epitaxial quality of the multiple quantum well layer 120 is improved, and a region of the nitrogen-containing semiconductor device 100 adjacent to the well layer 122A may have a preferable light emitting effect.

Besides, a thickness of the well layers 122 is in a range from 1 nanometer to 6 nanometers, and a thickness of the barrier layers 121 is in a range from 1 nanometer to 20 nanometers. However, the invention is not limited thereto.

Several other embodiments are provided below for further description. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
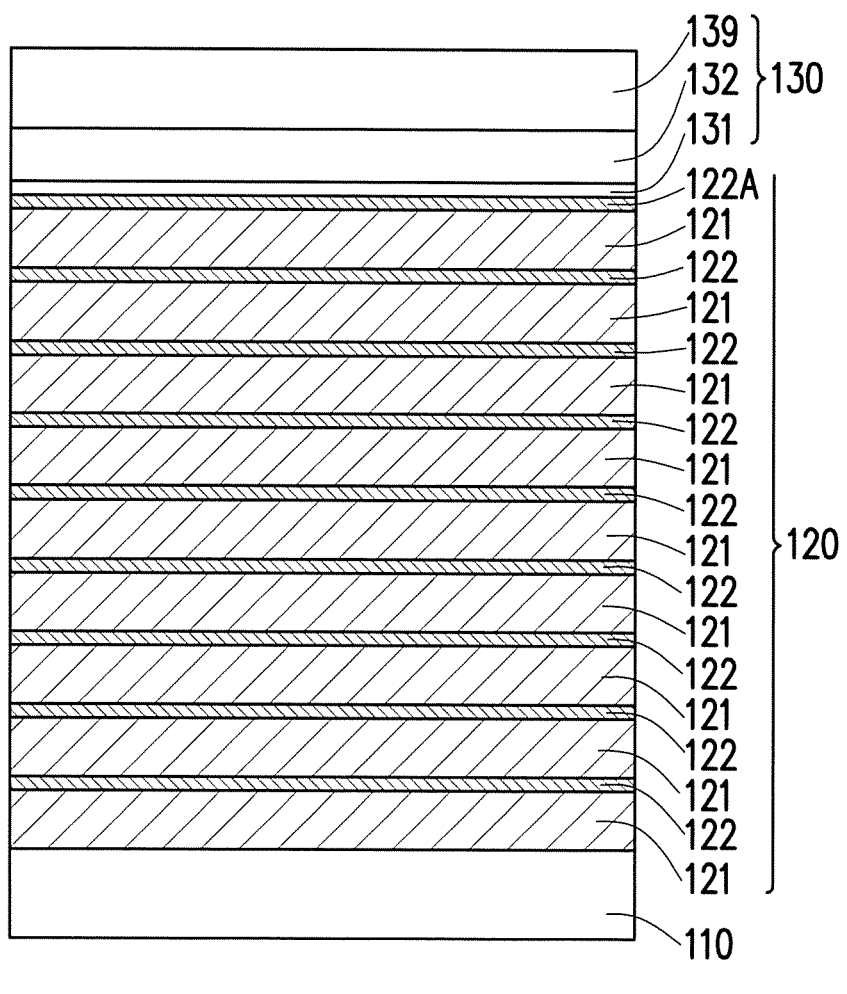
FIG. 2 is a schematic cross-sectional view illustrating a nitrogen-containing semiconductor device according to a second embodiment of the invention.

FIG. 2 is a schematic cross-sectional view illustrating a nitrogen-containing semiconductor device according to a second embodiment of the invention. Referring to FIG. 2, a nitrogen-containing semiconductor device 100A is substantially similar to the nitrogen-containing semiconductor device 100, but a main difference therebetween is that, in the embodiment, the second type doped semiconductor layer 130 of the nitrogen-containing semiconductor device 100A further includes a second AlInGaN layer 132.

The first AlInGaN layer 131 is disposed between the multiple quantum well layer 120 and the second AlInGaN layer 132, and the second AlInGaN layer 132 is doped with a second type dopant. In addition, a concentration of the second type dopant in the second AlInGaN layer 132 is greater than a concentration of the second type dopant in the first AlInGaN layer 131. Therefore, the second AlInGaN layer 132 may serve to further increase the carrier concentration of the multiple quantum well layer 120, thereby facilitating the overall light emitting effect of the nitrogen-containing semiconductor device 100A.

Specifically, the second type dopant in the second AlInGaN layer 132 is Mg, C, or Mg and C, for example, a doped concentration of Mg in the second AlInGaN layer 132 is greater than $1 \times 10^{19}$ cm$^{-3}$, a doped concentration of C in the second AlInGaN layer 132 is greater than $1 \times 10^{17}$ cm$^{-3}$, and a concentration of C in the second AlInGaN layer 132 is greater than a concentration of C in the first AlInGaN layer 131. Hence, C doped in the second AlInGaN layer 132 may activate Mg, thereby increasing the carrier concentration of the second type doped semiconductor layer 130.

In the embodiment, a material of the second AlInGaN layer 132 is $Al_{x1}In_{y1}Ga_{1-x1-y1}$, wherein $0 \leq x1 < 0.5$ and $0 \leq y1 < 0.3$. In addition, Al is distributed in a uniform concentration in the second AlInGaN layer 132, but the invention is not limited thereto. In other embodiments of the invention, Al in the second AlInGaN layer may be distributed in alternate higher and lower concentrations, or a concentration of Al may increase or decrease from a side connected to the first AlInGaN layer to a side away from the first AlInGaN layer. The invention does not intend to impose a limitation on this regard.

Besides, a thickness of the second AlInGaN layer 132 is between 0.1 nanometers and 150 nanometers, but the invention is not limited thereto.

Figure 3:
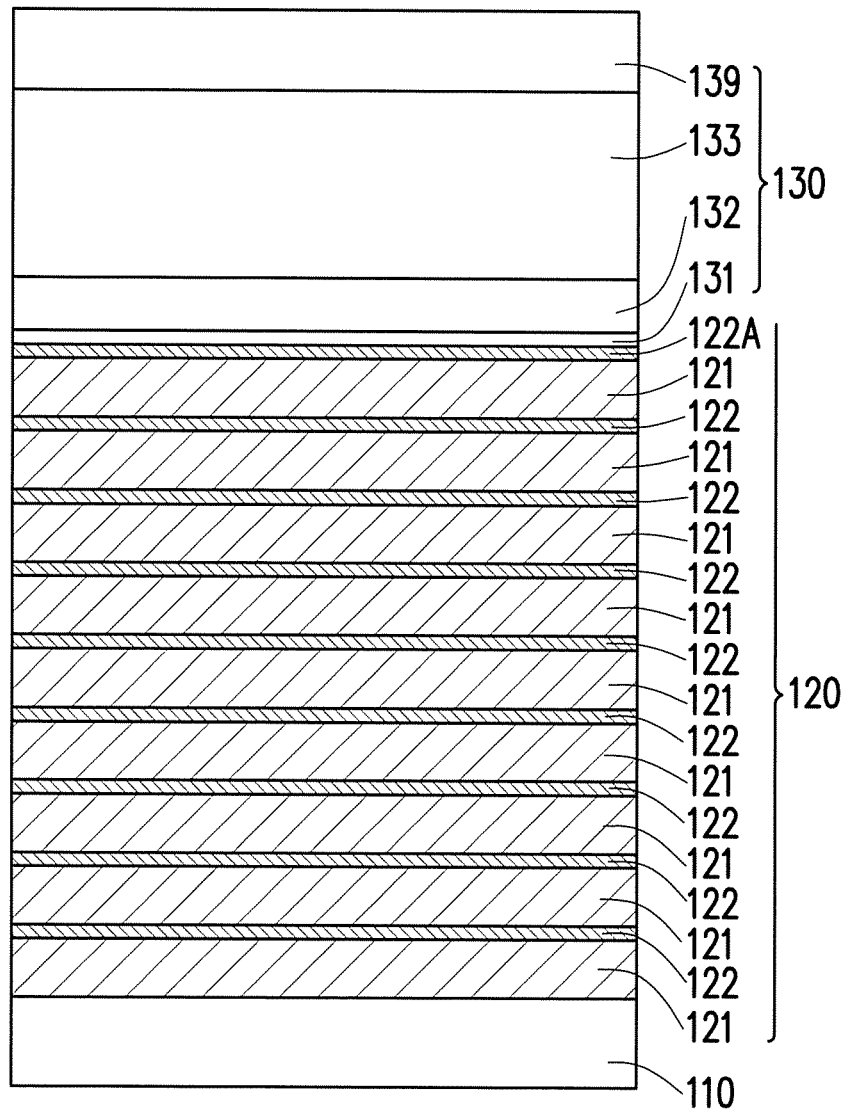
FIG. 3 is a schematic cross-sectional view illustrating a nitrogen-containing semiconductor device according to a third embodiment of the invention.

FIG. 3 is a schematic cross-sectional view illustrating a nitrogen-containing semiconductor device according to a second embodiment of the invention. Referring to FIG. 3, a nitrogen-containing semiconductor device 100B is substantially similar to the nitrogen-containing semiconductor device 100A, but a main difference therebetween is that, in the embodiment, the second type doped semiconductor layer 130 of the nitrogen-containing semiconductor device 100B further includes a third AlInGaN layer 133.

The second AlInGaN layer 132 is disposed between the first AlInGaN layer 131 and the third AlInGaN layer 133, and the third AlInGaN layer 133 is doped with a second type dopant. The third AlInGaN layer 133 may block carriers from the first type doped semiconductor layer 110 and thereby increase the carrier combination efficiency in the multiple quantum well layer 120.

Specifically, the second type dopant in the third AlInGaN layer 133 is Mg, C, or Mg and C, for example, a doped concentration of Mg in the third AlInGaN layer 133 is greater than $1 \times 10^{19}$ cm$^{-3}$, and a doped concentration of C in the third AlInGaN layer 133 is greater than $1 \times 10^{17}$ cm$^{-3}$. Therefore, the third AlInGaN layer 133 may be a desired electron stopping layer.

In the embodiment, a material of the third AlInGaN layer 133 is $Al_{x1}In_{y1}Ga_{1-x1-y1}$, wherein $0 \leq x1 < 0.5$, and $0 \leq y1 < 0.3$. In addition, Al is distributed in a uniform concentration in the third AlInGaN layer 133, but the invention is not limited thereto.

In other embodiments of the invention, Al in the third AlInGaN layer 133 of the second type doped semiconductor layer 130 may be distributed in alternate higher and lower concentrations, or the concentration of Al may increase or decrease from a side connected to the second AlInGaN layer 132 to a side away from the second AlInGaN layer 132.

Moreover, in the third embodiment of the invention, a thickness of the third AlInGaN layer 133 is between 0.1 nanometers and 200 nanometers.

Figure 4:
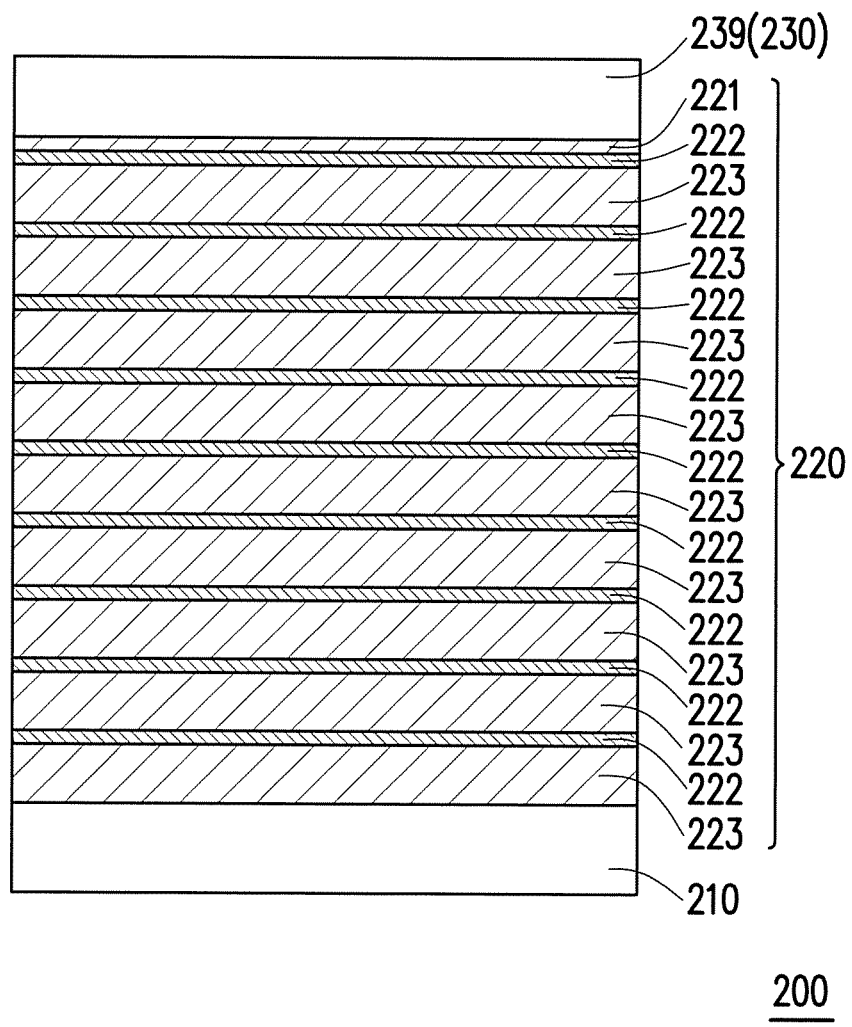
FIG. 4 is a schematic cross-sectional view illustrating a nitrogen-containing semiconductor device according to a fourth embodiment of the invention.

FIG. 4 is a schematic cross-sectional view illustrating a nitrogen-containing semiconductor device according to a fourth embodiment of the invention. Referring to FIG. 4, a nitrogen-containing semiconductor device 200 of the fourth embodiment of the invention includes a first type doped semiconductor layer 210, a multiple quantum well layer 220, and a second type doped semiconductor layer 230. The multiple quantum well layer 220 includes a first barrier layer 221, a plurality of second barrier layers 223, and a plurality of well layers 222. In other words, the first barrier layer 221 and one of the second barrier layers 223 are respectively disposed at two opposite sides of the multiple quantum well layer 220.

Referring to FIG. 4, a thickness of the first barrier layer 221 is less than a thickness of the second barrier layers 223, and the well layers 222 are alternately arranged with the first barrier layer 221 and the second barrier layers 222. The multiple quantum well layer 220 is located between the first type doped semiconductor layer 210 and the second type doped semiconductor layer 230. In addition, the first barrier layer 221 is connected to the second type doped semiconductor layer 230.

Accordingly, a thickness of the first barrier layer 221 disposed in the multiple quantum well 220 and connected to the second type doped semiconductor layer 230 is smaller. Thus, carriers from the second type doped semiconductor layer 230 may more effectively enter the multiple quantum well layer 220.

Specifically, in the embodiment, the first type doped semiconductor layer 210 is an n-type doped semiconductor layer providing electrons, for example, and the second type doped semiconductor layer 220 is a p-type doped semiconductor layer providing holes, for example. Since the first barrier layer 122A is disposed at a side of the multiple quantum well layer 220 connected to the second type doped semiconductor layer 220, holes from the second type doped semiconductor layer 220 may more effectively enter the multiple quantum well layer 220 through the first barrier layer 221, thereby increasing the efficiency of electron-hole combination of the multiple quantum well layer 220. In other words, the multiple quantum well 220 of the embodiment enables a preferable electrical connection performance as well as light emitting efficiency of the nitrogen-containing semiconductor device 200.

Referring to FIG. 4, the thickness of the first barrier layer 221 of the embodiment is in a range from 0.1 nanometers to 20 nanometers, and a material of the first barrier layer 221 includes AlInGaN. Moreover, the first barrier layer 221 is doped with a second type dopant. Therefore, the first barrier layer 221 may provide holes and also serve as a passivation layer of the well layers 222.

More specifically, the second type dopant of the first barrier layer 221 of the embodiment is Mg, and a doped concentration of Mg in the first barrier layer 221 is greater than $1\times10^{19}$ cm$^{-3}$. Besides, in addition to serving as the passivation layer of the well layers 222, the first barrier layer 221 may also inject holes into the well layers 222.

In the embodiment, a material of the first barrier layer 221 is $Al_{x1}In_{y1}Ga_{1-x1-y1}$, wherein $0 \leq x1 < 0.5$, and $0 \leq y1 < 0.3$. In addition, Al is distributed in a uniform concentration in the first barrier layer 221, but the invention is not limited thereto.

In other embodiments of the invention, the material of the first barrier layer 221 may be changed from $Al_{x1}In_{y1}Ga_{1-x1-y1}$ to $Al_{x2}In_{y2}Ga_{1-x2-y2}$, wherein $0 \leq x1, x2 < 0.5$, $0 \leq y1, y2 < 0.3$, and $x1 < x2$, and a concentration of Al in the first barrier layer 221 may increase from a side of the first barrier layer 221 connected to one of the well layers 222 to a side away from the well layers 222.

The second type doped semiconductor layer 230 includes a GaN layer 239. The GaN layer 239 is doped with a second type dopant. In addition, the GaN layer 239 is disposed at a side of the second type doped semiconductor layer 230 away from the first barrier layer 221. More specifically, the second type dopant doped in the GaN layer 239 is Mg, for example. However, the invention is not limited thereto.

Moreover, the well layers 222 and the second barrier layers 223 of the embodiment are InGaN layers doped with a first type dopant. The first barrier layer 221 is a GaN layer doped with a second type dopant. A material of the well layers 222 is $In_xGa_{1-x}N$, wherein $0.01 \leq x < 0.5$. A concentration of the first type dopant in the well layer 222 connected to the first barrier layer 221 is lower than a concentration of the first type dopant in rest of the well layers 222. Therefore, the first type dopant of the multiple quantum well layer 220 and the second type dopant of the second type doped semiconductor layer 230 may be prevented from being mixed with each other.

In the embodiment, the first type dopant of the second barrier layers 223 and the well layers 222 of the embodiment is Si. A concentration of Si in the well layer 222 connected to the first barrier layer 221 is greater than $1\times10^{17}$ cm$^{-3}$, a concentration of Si in the rest of the well layers 222 is greater than $3\times10^{17}$ cm$^{-3}$, and a concentration of Si in the second barrier layers 223 is greater than $3\times10^{17}$ cm$^{-3}$.

Besides, a thickness of the well layers 222 is in a range from 1 nanometer to 6 nanometers, and a thickness of the second barrier layers 223 is in a range from 1 nanometer to 20 nanometers.

Several other embodiments are provided below for further description. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 5:
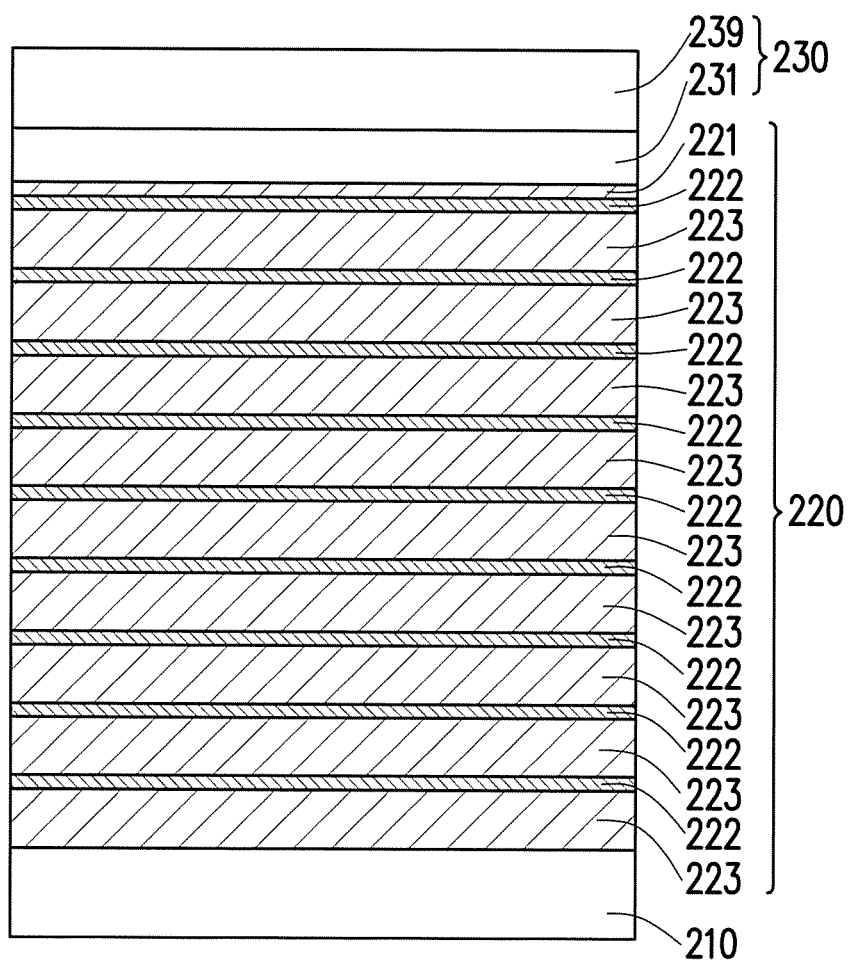
FIG. 5 is a schematic cross-sectional view illustrating a nitrogen-containing semiconductor device according to a fifth embodiment of the invention.

FIG. 5 is a schematic cross-sectional view illustrating a nitrogen-containing semiconductor device according to a fifth embodiment of the invention. Referring to FIG. 5, a nitrogen-containing semiconductor device 200A is substantially similar to the nitrogen-containing semiconductor device 200, but a main difference therebetween is that, in the embodiment, the second type doped semiconductor layer 230 of the nitrogen-containing semiconductor device 200A further includes a first AlInGaN layer 231.

The first AlInGaN layer 231 is connected to the multiple quantum well layer 220 and is doped with a second type dopant. In addition, a concentration of the second type dopant in the first AlInGaN layer 231 is greater than a concentration of the second type dopant in the first barrier layer 221. Therefore, the first AlInGaN layer 231 may serve to further increase the carrier concentration of the multiple quantum well layer 220, thereby facilitating the overall light emitting effect of the nitrogen-containing semiconductor device 200A.

Specifically, the second type dopant in the first AlInGaN layer 231 is Mg, C, or Mg and C, for example, a doped concentration of Mg in the first AlInGaN layer 231 is greater than $1\times10^{19}$ cm$^{-3}$, a doped concentration of C in the first AlInGaN layer 231 is greater than $1\times10^{17}$ cm$^{-3}$, and a concentration of C in the first AlInGaN layer 231 is greater than a concentration of C in the barrier layer 221. Hence, C doped in the first AlInGaN layer 231 may activate Mg, thereby increasing the carrier concentration of the second type doped semiconductor layer 230.

In the embodiment, a material of the first AlInGaN layer 231 is $Al_{x1}In_{y1}Ga_{1-x1-y1}$, wherein $0 \leq x1 < 0.5$, and $0 \leq y1 < 0.3$. In addition, Al is distributed in a uniform concentration in the first AlInGaN layer 231, but the invention is not limited thereto. In other embodiments of the invention, Al in the first AlInGaN layer connected to the barrier layer may be distributed in alternate higher and lower concentrations, or a concentration of Al may increase or decrease from a side connected to the first AlInGaN layer to a side away from the first AlInGaN layer. The invention does not intend to impose a limitation on this regard.

Besides, a thickness of the first AlInGaN layer 231 is in a range from 0.1 nanometers to 150 nanometers, but the invention is not limited thereto.

Figure 6:
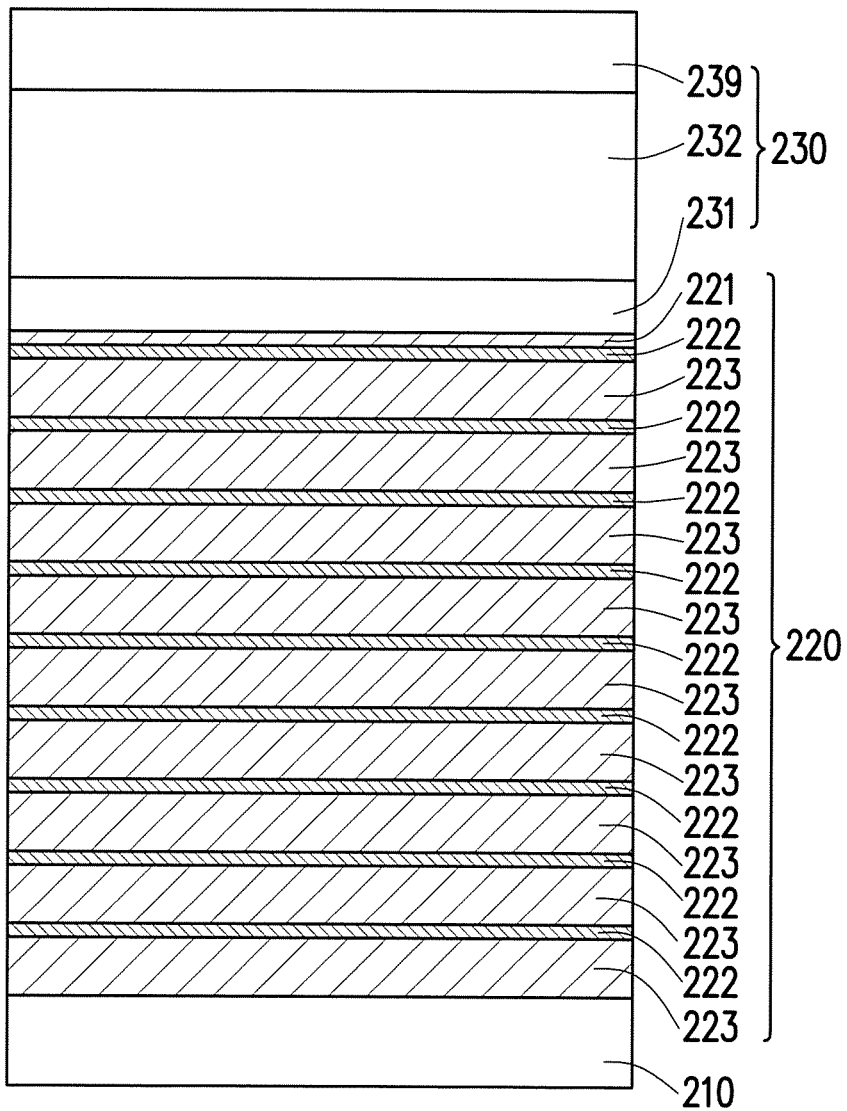
FIG. 6 is a schematic cross-sectional view illustrating a nitrogen-containing semiconductor device according to a sixth embodiment of the invention.

FIG. 6 is a schematic cross-sectional view illustrating a nitrogen-containing semiconductor device according to a sixth embodiment of the invention. Referring to FIG. 6, a nitrogen-containing semiconductor device 200B is substantially similar to the nitrogen-containing semiconductor device 200A, but a main difference therebetween is that, in the embodiment, the second type doped semiconductor layer 230 of the nitrogen-containing semiconductor device 200B further includes a second AlInGaN layer 232.

The first AlInGaN layer 231 is disposed between the second AlInGaN layer 232 and the multiple quantum well layer 220, and the second AlInGaN layer 232 is doped with a second type dopant. The second AlInGaN layer 232 may block carriers from the first type doped semiconductor layer 210 and thereby increase the carrier combination efficiency in the multiple quantum well layer 220.

Specifically, the second type dopant in the second AlInGaN layer 232 is Mg, C, or Mg and C, for example, the doped concentration of Mg in the second AlInGaN layer 232 is greater than $1\times10^{19}$ cm$^{-3}$, and the doped concentration of C in the second AlInGaN layer 232 is greater than $1\times10^{17}$ cm$^{-3}$. Therefore, the second AlInGaN layer 232 may serve as a preferable electron stopping layer.

In the embodiment, a material of the second AlInGaN layer 232 is $Al_{x1}In_{y1}Ga_{1-x1-y1}N$, wherein $0 \leq x1 < 0.5$ and $0 \leq y1 < 0.3$. In addition, Al is distributed in a uniform concentration in the second AlInGaN layer 232, but the invention is not limited thereto.

In other embodiments of the invention, Al in the second AlInGaN layer of the second type doped semiconductor layer may be distributed in alternate higher and lower concentrations, or a concentration of Al may increase or decrease from a side connected to the first AlInGaN layer to a side away from the first AlInGaN layer.

Moreover, in the sixth embodiment of the invention, a thickness of the second AlInGaN layer 232 is between 0.1 nanometers and 200 nanometers.

In view of the foregoing, in the nitrogen-containing semiconductor device according to an embodiment of the invention, one of the well layers of the multiple quantum well layer is connected to the second type doped semiconductor layer. Therefore, the carrier concentration of the multiple quantum well layer is increased, thereby facilitating the carrier combination efficiency and providing preferable light emitting efficiency. The nitrogen-containing semiconductor device according to another embodiment of the invention includes the first barrier layer having a thinner thickness and connected to the second type doped semiconductor layer. Therefore, more carriers are able to pass through the first barrier layer, thereby facilitating the carrier combination efficiency in the multiple quantum well layer and providing preferable light emitting efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nitrogen-containing semiconductor device, comprising:
    a first type doped semiconductor layer;
    a multiple quantum well layer, comprising:
        a plurality of barrier layers; and
        a plurality of well layers, alternately arranged with the barrier layers; and
    a second type doped semiconductor layer, wherein the multiple quantum well layer is located between the first type doped semiconductor layer and the second type doped semiconductor layer, and one of the well layers is connected to the second type doped semiconductor layer, the first type doped semiconductor layer and the second type doped semiconductor layer are of opposite polarity, the second type doped semiconductor layer comprises a first AlInGaN layer connected to the multiple quantum well layer, and the first AlInGaN layer is doped with a second type dopant, and the second type doped semiconductor layer further comprises a second AlInGaN layer, the first AlInGaN layer is disposed between the multiple quantum well layer and the second AlInGaN layer, the second AlInGaN layer is doped with a second type dopant, and a concentration of the second type dopant in the second AlInGaN layer is greater than a concentration of the second type dopant in the first AlInGaN layer.

2. The nitrogen-containing semiconductor device as claimed in claim 1, wherein the second type dopant in the first AlInGaN layer is Mg, and a doped concentration of Mg in the first AlInGaN layer is greater than $1\times10^{19}$ cm$^{-3}$.

3. The nitrogen-containing semiconductor device as claimed in claim 1, wherein a concentration of Al in the first AlInGaN layer is substantially uniform or increases from a side connected to the multiple quantum well layer to a side away from the multiple quantum well layer.

4. The nitrogen-containing semiconductor device as claimed in claim 1, wherein the second type dopant in the second AlInGaN layer is Mg, C, or Mg and C, a doped concentration of Mg in the second AlInGaN layer is greater than $1\times10^{19}$ cm$^{-3}$, a doped concentration of C in the second AlInGaN layer is greater than $1\times10^{17}$ cm$^{-3}$, and a concentration of C in the second AlInGaN layer is greater than a concentration of C in the first AlInGaN layer.

5. The nitrogen-containing semiconductor device as claimed in claim 1, wherein Al is distributed in a uniform concentration or distributed in alternate higher and lower concentrations in the second AlInGaN layer, or a concentration of Al in the second AlInGaN layer increases or decreases from a side connected to the first AlInGaN layer to a side away from the first AlInGaN layer.

6. The nitrogen-containing semiconductor device as claimed in claim 1, wherein the second type doped semiconductor layer further comprises a third AlInGaN layer, the second AlInGaN layer is disposed between the first AlInGaN layer and the third AlInGaN layer, and the third AlInGaN layer is doped with a second type dopant.

7. The nitrogen-containing semiconductor device as claimed in claim 6, wherein the second type dopant in the third AlInGaN layer is Mg, C, or Mg and C, a doped concentration of Mg in the third AlInGaN layer is greater than $1\times10^{19}$ cm$^{-3}$, and a doped concentration of C in the third AlInGaN layer is greater than $1\times10^{17}$ cm$^{-3}$.

8. The nitrogen-containing semiconductor device as claimed in claim 6, wherein Al is distributed in a uniform concentration or distributed in alternate higher and lower concentrations in the third AlInGaN layer, or a concentration of Al in the third AlInGaN layer increases or decreases from a side connected to the second AlInGaN layer to a side away from the second AlInGaN layer.

9. The nitrogen-containing semiconductor device as claimed in claim 1, wherein the second type doped semiconductor layer further comprises a GaN layer, the GaN layer is doped with a second type dopant, and the GaN layer and the first AlInGaN layer are disposed at two sides of the second type doped semiconductor layer.

10. The nitrogen-containing semiconductor device as claimed in claim 1, wherein the well layers are InGaN layers doped with a first type dopant, the barrier layers are GaN layers doped with a first type dopant, and a concentration of the first type dopant in the well layer connected to the second type doped semiconductor layer is lower than a concentration of the first type dopant in the rest of the well layers.

11. The nitrogen-containing semiconductor device as claimed in claim 10, wherein the first type dopant in the barrier layers and the well layers is Si, a concentration of Si in the well layer connected to the second type doped semiconductor layer is greater than $1\times10^{17}$ cm$^{-3}$, a concentration of Si in the rest of the well layers is greater than $3\times10^{17}$ cm$^{-3}$, and a concentration of Si in the barrier layers is greater than $3\times10^{17}$ cm$^{-3}$.

12. A nitrogen-containing semiconductor device, comprising:
a first type doped semiconductor layer;
a multiple quantum well layer, comprising:
a first barrier layer;
a plurality of second barrier layers, wherein a thickness of the first barrier layer is less than a thickness of the second barrier layers; and
a plurality of well layers, alternately arranged with the first bather layer and the second barrier layers; and
a second type doped semiconductor layer, wherein the first type doped semiconductor layer and the second type doped semiconductor layer are of opposite polarity, the multiple quantum well layer is located between the first type doped semiconductor layer and the second type doped semiconductor layer, and the first barrier layer is connected to the second type doped semiconductor layer.

13. The nitrogen-containing semiconductor device as claimed in claim 12, wherein a material of the first barrier layer comprises AlInGaN, and the first barrier layer is doped with a second type dopant.

14. The nitrogen-containing semiconductor device as claimed in claim 13, wherein the second type dopant in the first barrier layer is Mg, and a doped concentration of Mg in the first barrier layer is greater than $1\times10^{19}$ cm$^{-3}$.

15. The nitrogen-containing semiconductor device as claimed in claim 13, wherein a concentration of Al in the first barrier layer is substantially uniform or increases from a side connected to a well layer of the well layers to a side away from the well layer.

16. The nitrogen-containing semiconductor device as claimed in claim 13, wherein the second type doped semiconductor layer further comprises a first AlInGaN layer, the first AlInGaN layer is connected to the first barrier layer, the first AlInGaN layer is doped with a second type dopant, and a concentration of the second type dopant in the first AlInGaN layer is greater than a concentration of the second type dopant in the first barrier layer.

17. The nitrogen-containing semiconductor device as claimed in claim 16, wherein the second type dopant in the first AlInGaN layer is Mg, C, or Mg and C, a doped concentration of Mg in the first AlInGaN layer is greater than $1\times10^{19}$ cm$^{-3}$, a doped concentration of C in the first AlInGaN layer is greater than $1\times10^{17}$ cm$^{-3}$, and a concentration of C in the first AlInGaN layer is greater than a concentration of C in the first barrier layer.

18. The nitrogen-containing semiconductor device as claimed in claim 16, wherein Al is distributed in a uniform concentration or distributed in alternate higher and lower concentrations in the first AlInGaN layer, or a concentration of Al in the first AlInGaN layer increases from a side connected to the first barrier layer to a side away from the multiple quantum well layer.

19. The nitrogen-containing semiconductor device as claimed in claim 16, wherein the second type doped semiconductor layer further comprises a second AlInGaN layer, the first AlInGaN layer is disposed between the second AlInGaN layer and the first barrier layer, and the second AlInGaN layer is doped with a second type dopant.

20. The nitrogen-containing semiconductor device as claimed in claim 19, wherein the second type dopant in the second AlInGaN layer is Mg, C, or Mg and C, a doped concentration of Mg in the second AlInGaN layer is greater than $1\times10^{19}$ cm$^{-3}$, and a doped concentration of C in the second AlInGaN layer is greater than $1\times10^{17}$ cm$^{-3}$.

21. The nitrogen-containing semiconductor device as claimed in claim 19, wherein Al is distributed in a uniform concentration or distributed in alternate higher and lower concentrations in the second AlInGaN layer, or a concentration of Al in the second AlInGaN layer increases or decreases from a side connected to the first AlInGaN layer to a side away from the first AlInGaN layer.

22. The nitrogen-containing semiconductor device as claimed in claim 12, wherein the second type doped semiconductor layer comprises a GaN layer, the GaN layer is doped with a second type dopant, and the GaN layer is disposed at a side of the second type doped semiconductor layer away from the first barrier layer.

23. The nitrogen-containing semiconductor device as claimed in claim 12, wherein the well layers and the second barrier layers are InGaN layers doped with a first type dopant, the first barrier layer is a GaN layer doped with a second type dopant, and a concentration of the first type dopant in the well layer connected to the first barrier layer is lower than a concentration of the second type dopant in the rest of the well layers.

24. The nitrogen-containing semiconductor device as claimed in claim 23, wherein the first type dopant in the second barrier layers and the well layers is Si, a concentration of Si in the well layer connected to the first barrier layer is greater than $1\times10^{17}$ cm$^{-3}$, a concentration of Si in the rest of the well layers is greater than $3\times10^{17}$ cm$^{-3}$, and a concentration of Si in the second barrier layers is greater than $3\times10^{17}$ cm$^{3}$.

25. A nitrogen-containing semiconductor device, comprising:
a first type doped semiconductor layer;
a multiple quantum well layer, comprising:
a plurality of barrier layers; and
a plurality of well layers, alternately arranged with the barrier layers; and
a second type doped semiconductor layer, wherein the multiple quantum well layer is located between the first type doped semiconductor layer and the second type doped semiconductor layer, and one of the well layers is connected to the second type doped semiconductor layer, the first type doped semiconductor layer and the second type doped semiconductor layer are of opposite polarity, the second type doped semiconductor layer comprises a first AlInGaN layer connected to the multiple quantum well layer, and the first AlInGaN layer is doped with a second type dopant, wherein the second type doped semiconductor layer further comprises a GaN layer, the GaN layer is doped with a second type dopant, and the GaN layer and the first AlInGaN layer are disposed at two sides of the second type doped semiconductor layer.

26. The nitrogen-containing semiconductor device as claimed in claim 25, wherein the second type dopant in the first AlInGaN layer is Mg, and a doped concentration of Mg in the first AlInGaN layer is greater than $1\times10^{19}$ $cm^{-3}$.

27. The nitrogen-containing semiconductor device as claimed in claim 25, wherein a concentration of Al in the first AlInGaN layer is substantially uniform or increases from a side connected to the multiple quantum well layer to a side away from the multiple quantum well layer.

28. The nitrogen-containing semiconductor device as claimed in claim 25, wherein the second type doped semiconductor layer further comprises a second AlInGaN layer, the first AlInGaN layer is disposed between the multiple quantum well layer and the second AlInGaN layer, the second AlInGaN layer is doped with a second type dopant, and a concentration of the second type dopant in the second AlInGaN layer is greater than a concentration of the second type dopant in the first AlInGaN layer.

29. The nitrogen-containing semiconductor device as claimed in claim 28, wherein the second type dopant in the second AlInGaN layer is Mg, C, or Mg and C, a doped concentration of Mg in the second AlInGaN layer is greater than $1\times10^{19}$ $cm^{-3}$, a doped concentration of C in the second AlInGaN layer is greater than $1\times10^{17}$ $cm^{-3}$, and a concentration of C in the second AlInGaN layer is greater than a concentration of C in the first AlInGaN layer.

30. The nitrogen-containing semiconductor device as claimed in claim 28, wherein Al is distributed in a uniform concentration or distributed in alternate higher and lower concentrations in the second AlInGaN layer, or a concentration of Al in the second AlInGaN layer increases or decreases from a side connected to the first AlInGaN layer to a side away from the first AlInGaN layer.

31. The nitrogen-containing semiconductor device as claimed in claim 28, wherein the second type doped semiconductor layer further comprises a third AlInGaN layer, the second AlInGaN layer is disposed between the first AlInGaN layer and the third AlInGaN layer, and the third AlInGaN layer is doped with a second type dopant.

32. The nitrogen-containing semiconductor device as claimed in claim 31, wherein the second type dopant in the third AlInGaN layer is Mg, C, or Mg and C, a doped concentration of Mg in the third AlInGaN layer is greater than $1\times10^{19}$ $cm^{-3}$, and a doped concentration of C in the third AlInGaN layer is greater than $1\times10^{17}$ $cm^{-3}$.

33. The nitrogen-containing semiconductor device as claimed in claim 31, wherein Al is distributed in a uniform concentration or distributed in alternate higher and lower concentrations in the third AlInGaN layer, or a concentration of Al in the third AlInGaN layer increases or decreases from a side connected to the second AlInGaN layer to a side away from the second AlInGaN layer.

34. The nitrogen-containing semiconductor device as claimed in claim 25, wherein the well layers are InGaN layers doped with a first type dopant, the barrier layers are GaN layers doped with a first type dopant, and a concentration of the first type dopant in the well layer connected to the second type doped semiconductor layer is lower than a concentration of the first type dopant in the rest of the well layers.

35. The nitrogen-containing semiconductor device as claimed in claim 34, wherein the first type dopant in the barrier layers and the well layers is Si, a concentration of Si in the well layer connected to the second type doped semiconductor layer is greater than $1\times10^{17}$ $cm^{-3}$, a concentration of Si in the rest of the well layers is greater than $3\times10^{17}$ $cm^{-3}$, and a concentration of Si in the barrier layers is greater than $3\times10^{17}$ $cm^{-3}$.

* * * * *